United States Patent [19]

Jansen et al.

[11] Patent Number: 5,199,907
[45] Date of Patent: Apr. 6, 1993

[54] ELECTRICAL CONNECTOR HAVING CONTACTS WITH BOARD RETENTION FEATURE

[75] Inventors: Ronald P. Jansen, Mechanicsburg; Mark R. Thumma, Oberlin, both of Pa.

[73] Assignee: AMP Incorporated, Harrisburg, Pa.

[21] Appl. No.: 900,644

[22] Filed: Jun. 18, 1992

[51] Int. Cl.$^5$ .................................. H01R 13/41
[52] U.S. Cl. ............................ 439/751; 439/82
[58] Field of Search .................... 439/81–84, 439/751

[56] References Cited

U.S. PATENT DOCUMENTS 4,900,276 2/1990 Doutrich .................. 439/751

FOREIGN PATENT DOCUMENTS 3329650 3/1985 Fed. Rep. of Germany ........ 439/81

*Primary Examiner*—Eugene F. Desmond

[57] ABSTRACT

An electrical connector (10) wherein the contacts (32, 34) have tail portions (40, 46) extending into respective holes (18) of a printed circuit board (16). The tail portions are gently curved, which provides a centering of the distal ends (48, 56) of the tail portions over the respective circuit board holes and also results in a low insertion force. Retention is provided by friction of the tail portions against the walls of the holes. The gentle curve of the tail portions keeps them close to the walls of the respective holes so that when a surface mount solder process is utilized, each tail portion provides a wicking action to concentrate the small amount of solder which is available in the region where the tail portion is close to the wall, resulting in a strong mechanical and electrical solder joint without requiring the hole to filled with solder. Also, minimum vibration is generated when the tail portions are inserted into the holes so that other temporarily retained components on the board are not displaced.

10 Claims, 4 Drawing Sheets

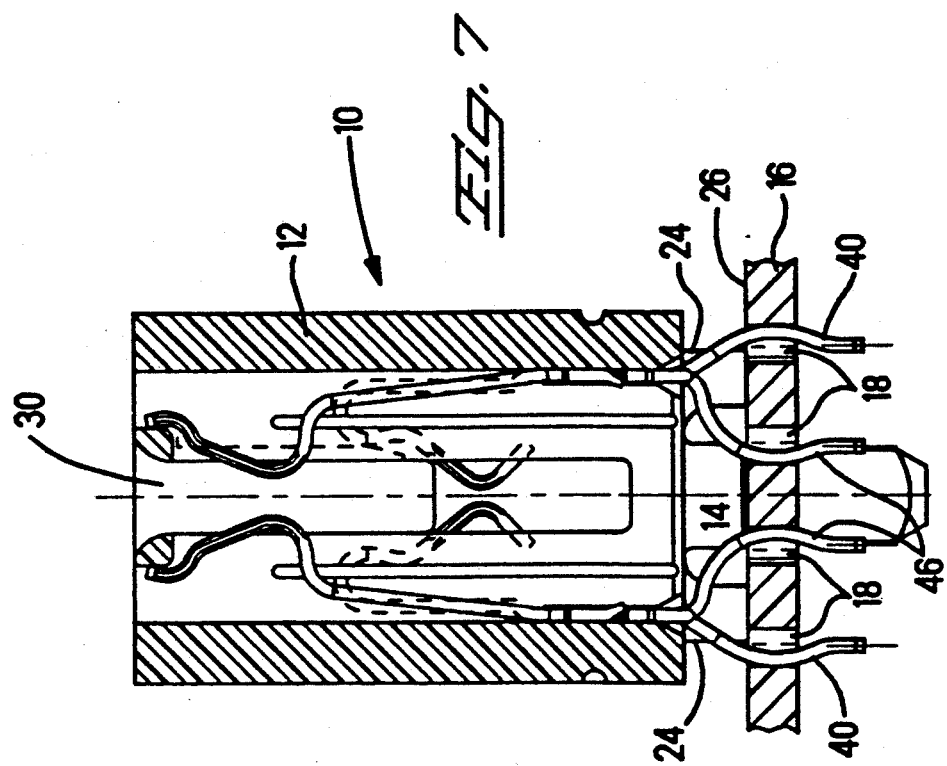
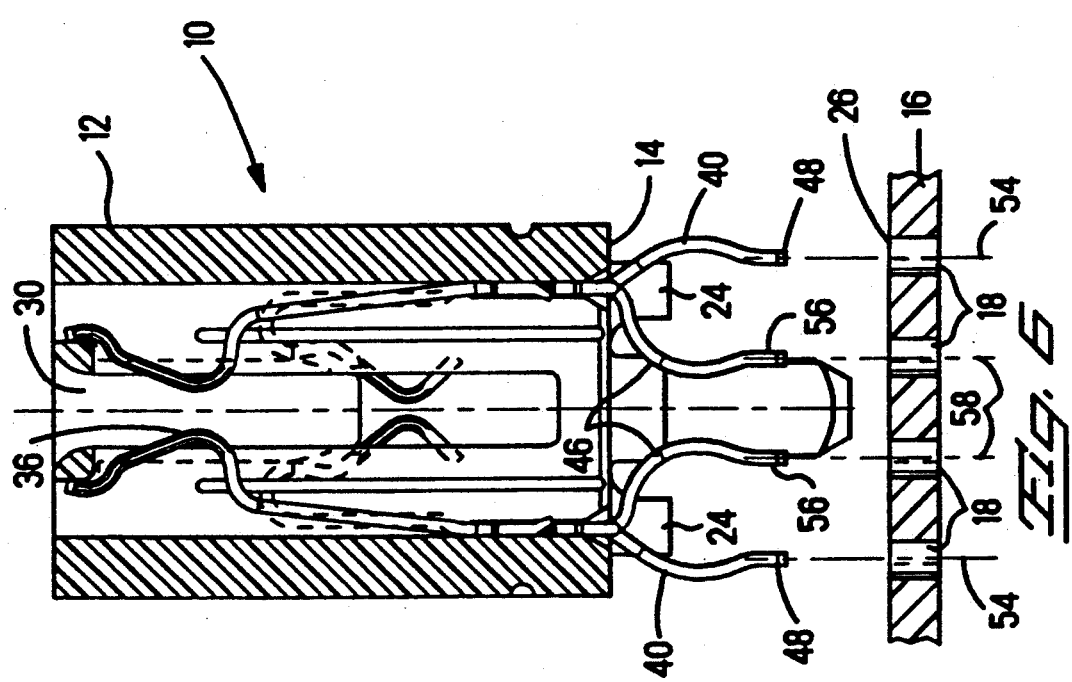

ELECTRICAL CONNECTOR HAVING CONTACTS WITH BOARD RETENTION FEATURE

BACKGROUND OF THE INVENTION

This invention relates to electrical connectors and, more particularly, to such a connector with the ability to be retained to a circuit board during soldering and which accommodates surface mount solder joints in printed circuit board holes.

When mounting and electrically interconnecting components on a printed circuit board, two commonly used processes are wave soldering and surface mount soldering. For wave soldering, leads from the individual components are inserted into respective holes in the printed circuit board from a top surface thereof. Additionally, contacts from an electrical connector to be mounted to the board are inserted into respective holes from the top surface. A wave of molten solder is then applied to the bottom surface of the board. The solder enters the holes, filling them and making mechanical and electrical connections.

In the surface mount process, a solder paste is applied to the top surface of the board in a desired pattern. The solder paste is tacky and the components are thereafter placed on the board with their leads extending into the solder paste so that the components are temporarily held in place. The board is then subjected to a process which heats and melts the solder to make the mechanical and electrical connections. In the past, when components were surface mount soldered to a printed circuit board, the electrical connector was subsequently put in position on the board and then a wave soldering step was utilized. This extra step is disadvantageous in that it requires additional time as well as requiring wave soldering equipment. It would be desirable to be able to eliminate this extra step and the wave soldering equipment when electrical components are surface mount soldered to a printed circuit board.

It is therefore an object of the present invention to provide an electrical connector which is amenable to surface mount soldering. Accordingly, connectors then could advantageously be mounted to both sides of a printed circuit board.

In contrast with the wave soldering process, the amount of solder in the surface mount process that can enter a circuit board hole is limited. Accordingly, it is another object of the present invention to provide an electrical connector which can be surface mount soldered to a printed circuit board with a small amount of solder and still maintain a good mechanical and electrical joint.

When surface mounting a connector to a circuit board after the other electrical components have been temporarily adhered to the solder paste, care must be taken to keep vibrations to a minimum so that the electrical components are not displaced. Accordingly, it is another object of this invention to provide contacts extending from the connector which can be inserted into circuit board holes with a low insertion force, provide retention for the connector, and not generate vibration which would displace the other electrical components.

SUMMARY OF THE INVENTION

The foregoing and additional objects are attained in accordance with the principles of this invention by providing an electrical connector having a housing and a plurality of contacts disposed in the housing. Each of the contacts has a tail portion which extends out of the housing. Each tail portions is configured with a gentle curve (i.e., having relatively large radii of curvature) which provides a centering of the tail portion tip over the respective circuit board hole. Each tail portion curve has a high region which extends beyond the perimeter of the hole. The slope of the gentle curve results in a low insertion force for the tail portion and retention of the tail portion in the hole is provided by friction of the tail portion against the walls of the hole. Further, the use of a gentle curve with relatively large radii of curvature maintains each tail portion close to the wall of its hole over a relatively long distance which advantageously provides a wicking action to concentrate the small amount of solder from the surface mount solder process in the region where the tail portion is close to the wall, so as to result in a strong mechanical and electrical solder joint without requiring the hole to be filled with solder.

BRIEF DESCRIPTION OF THE DRAWINGS

The foregoing will be more readily apparent upon reading the following description in conjunction with the drawings in which like elements in different figures thereof have the same reference numeral and wherein:

FIG. 6 is a view showing the connector of FIG. 1 prior to insertion of the contacts into the circuit board holes of FIG. 2;

FIG. 7 is a view similar to FIG. 6 showing the contacts after insertion into the circuit board holes;

DETAILED DESCRIPTION

Figure 1:
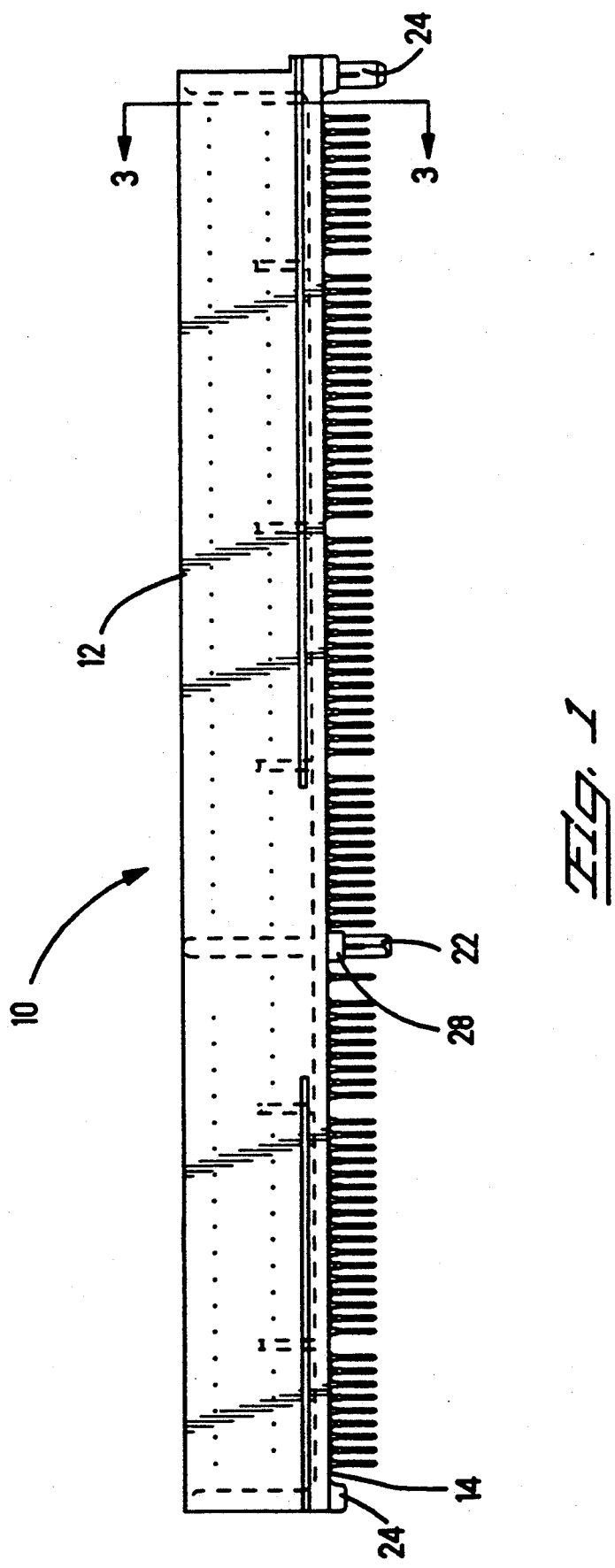
FIG. 1 is a side view of an illustrative connector constructed according to this invention.
Figure 2:
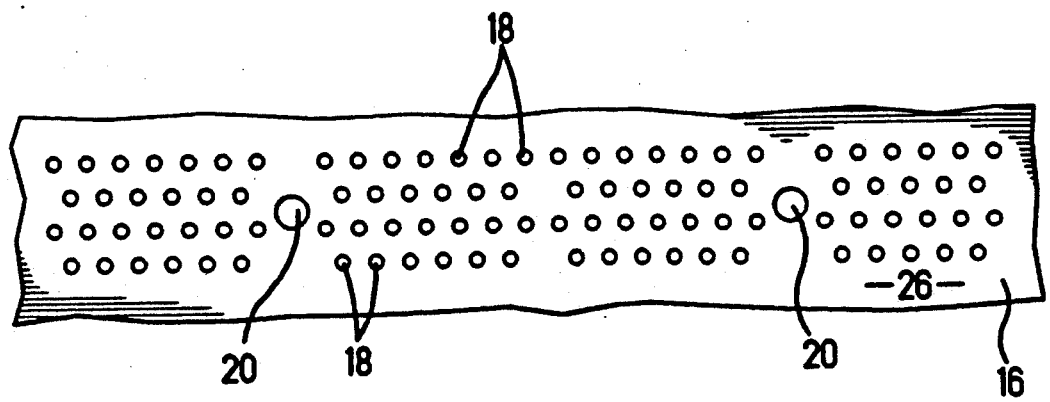
FIG. 2 is a top plan view of a portion of a circuit board showing an illustrative hole pattern for the connector of FIG. 1.

Referring to the drawings, FIG. 1 shows an illustrative bi-level dual position edge connector 10. The connector 10 includes a housing 12 having a mounting face 14. As is conventional, a plurality of contact-receiving passageways (not shown) extend through the housing 12 transverse to the mounting face 14. The connector 10 is adapted for mounting to a printed circuit board 16 (FIG. 2) which is provided with an array of plated through holes 18. Each of the holes 18 functions to receive therein a tail portion of a respective contact of the connector 10. The holes 18 are staggered so that traces on the circuit board can be routed therebetween. The board 16 is also provided with a pair of guide holes 20 for accepting guide pins 22 of the connector 10. The housing 12 of the connector 10 is also formed with standoffs 24 which function to space the mounting face 14 from the top surface 26 of the board 16. Additionally, the guide pins 22 are formed with enlarged shoulders 28 which serve the same function as the standoffs 24.

Illustratively, the connector 10 includes an elongated cavity 30 in its housing 12 for accepting an edge of a mating circuit board. For the particular connector 10 illustrated herein, connections to the mating board are made at two levels and to both sides of the mating board. Therefore, the contacts of the connector 10 are configured for either a low level connection or a high level connection.

Figure 3:
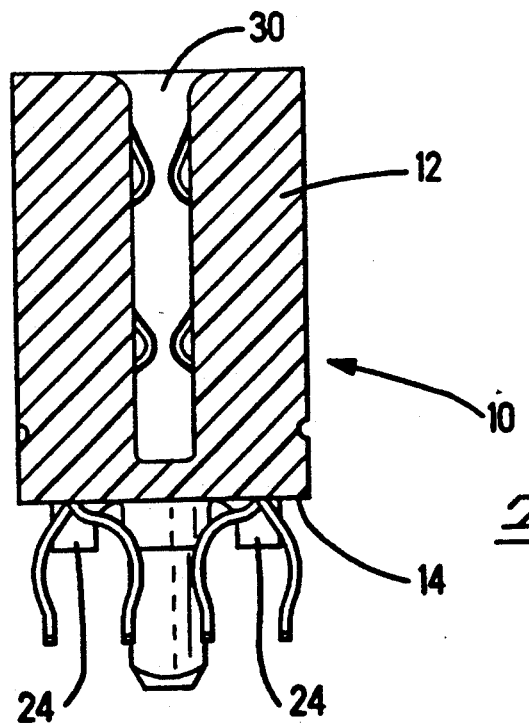
FIG. 3 is a cross sectional view taken along the line 3—3 in FIG. 1.
Figure 5:
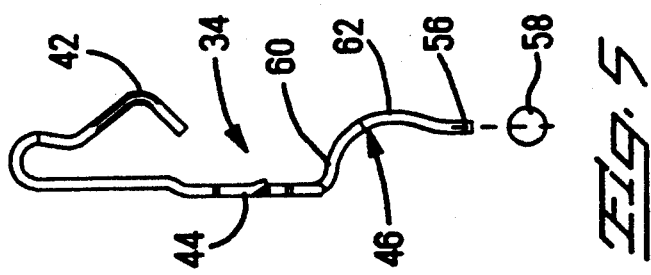
FIG. 5 is a side view of a second contact for use in the connector of FIG. 1.
Figure 4:
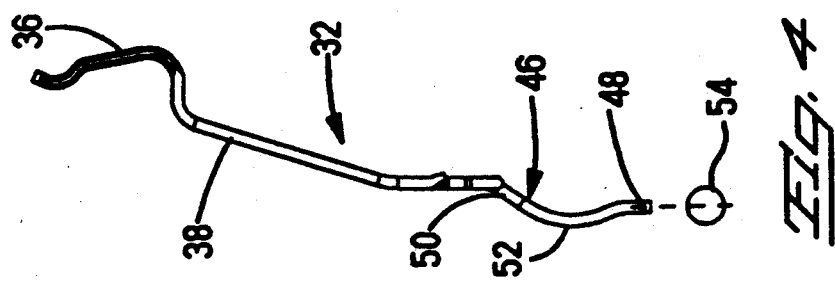
FIG. 4 is a side view of a first contact for use in the connector of FIG. 1.

FIG. 4 illustrates a contact 32 adapted for a high level connection and FIG. 5 illustrates a contact 34 adapted for a low level connection. The contact 32 includes a contact portion 36 which extends into the cavity 30, an intermediate portion 38 which is captured in a contact-receiving passageway of the housing 12, and a tail portion 40 which extends out of the housing 12 beyond the mounting face 14. Similarly, the low level connection contact 34 includes a contact portion 42 which extends into the cavity 30, an intermediate portion 44 which is captured in a contact-receiving passageway of the housing 12, and a tail portion 46 which extends out of the housing 12 beyond the mounting face 14. The contacts 32 and 34 are preferably stamped from planar sheet stock material, and are bent to the configurations shown in FIGS. 4 and 5, with the original plane of the sheet stock material extending out of the paper. The contacts illustrated in FIGS. 4 and 5 are those contacts on the left side of the connector 10, when viewed in FIGS. 3, 6 and 7. For the contacts on the right side of the connector 10, the tail portions would be reversed; i.e., the tail portion 40 shown in FIG. 4 would replace the tail portion 46 shown in FIG. 5 and the tail portion 46 shown in FIG. 5 would replace the tail portion 40 shown in FIG. 4.

According to this invention, the tail portions 40, 46 are formed as smooth curves without any sharp bends or kinks and have relatively large radii of curvature so that low insertion forces are attained. In addition, the tail portions 40, 46 hug the walls of the circuit board holes 18 after insertion therein to produce a wicking action so that a relatively small amount of solder results in a good joint. As shown in FIG. 4, the tail portion 40 extends smoothly from its distal end 48 over a predetermined length to the point 50 toward the mounting face 14 (when disposed in the housing 12) without any sharp bends or kinks. The curve of the tail portion 40 between the distal end 48 and the point 50 is such that there is a high region 52 displaced from an axis 54 which passes through the distal end 48 and is parallel to the direction in which the tail portion 40 is inserted into a respective circuit board hole 18. More particularly, the curve of the tail portion 40 preferably includes the arc of a circle which includes the high region 52 so that the tail portion 40 extends beyond the axis 54 from the point 50 to the high region 52 and then extends back toward the axis 54 to the distal end 48. The distal end 48 preferably includes a generally straight section substantially parallel to the axis 54 when the tail portion 40 is relaxed.

The tail portion 46 (FIG. 5) is configured similarly to the tail portion 46, but with some minor differences due to the fact that it has to extend further away from where it exits the mounting face 14. Thus, the tail portion 46 includes a distal end 56 which is generally straight and parallel to an axis 58 passing therethrough, which axis 58 is parallel to the direction of insertion of the tail portion 46 into its respective circuit board hole 18. The tail portion 46 is smoothly curved from its distal end 56 over a predetermined length to a point 60. Between the straight portion of the distal end 56 and the point 60, the tail portion 46 is preferably formed to include first and second circular arcs. The first circular arc contains a high region 62 and preferably has the same radius of curvature as the circular arc of the tail portion 40. The second circular arc preferably has a reduced radius of curvature and continues to the point 60.

The points 50 (FIG. 4) and 60 (FIG. 5) are chosen to define the smoothly curved predetermined length of each tail portion so that when the connector 10 is mounted to the board 16 with the tail portions 40, 46 extending into respective circuit board holes 18, the smooth curves extend from the distal ends 48, 56 at least through the circuit board 16. In addition, the high regions 52, 62 are so located along that predetermined length that they are within the circuit board holes 18.

As is best shown in FIG. 6, the tail portions 40, 46 are configured so that the spacing of the distal ends 48, 56 is such that the distal ends 48, 56 are each substantially centered over a respective one of the circuit board holes 18 while the tail portions 40, 46 are relaxed prior to the connector 10 being mounted to the board 16. Further, the curves of the tail portions 40, 46 are such that when the connector 10 is positioned as in FIG. 6 with the distal ends 48, 56 substantially centered over the respective holes 18, the projections of the high regions 52, 62 onto the surface 26 of the circuit board 16 are outside the respective holes 18.

Mounting and retention of the connector 10 to the circuit board 16 occur as follows. The straight sections at the distal ends 48, 56 of the tail portions 40, 46 assist in the lead in of the tail portions 40, 46 into the respective circuit board holes 18. The gentle and smooth curves of the tail portions 40, 46, due to relatively large radii of curvature, maintains a steep angle of insertion which results in a low insertion force. Insertion of the tail portions 40, 46 into the holes 18 causes the tail portions 40, 46 to be displaced such that the high regions 52, 62 are moved toward the axes 54, 58, respectively. Insertion continues until the standoffs 24 abut the top surface 26 of the board 16, as shown in FIG. 7. At this stage, the high regions 52, 62 are within the holes 18 and the resiliency of the tail portions 40, 46 and their displacements from the relaxed positions causes them to exert a normal force against the interior walls of the respective holes 18. This normal force, multiplied by the coefficient of friction between the tail portions 40, 46 and the interior walls of the holes 18, constitutes the retention force opposing removal of the tail portions 40, 46 from the holes 18. The curves of the tail portions 40, 46 are chosen so that the insertion force for entry of the tail portions 40, 46 into the holes 18 is substantially equal to that retention force. It is noted that this must be empirically done for each combination of connector 10 and circuit board 16.

The contacts 32, 34 are divided into two groups, with the tail portions 40, 46 being curved in opposite directions from each other, as is clear from the drawings. This is so that a retention force against opposed walls can be generated.

Figure 9:
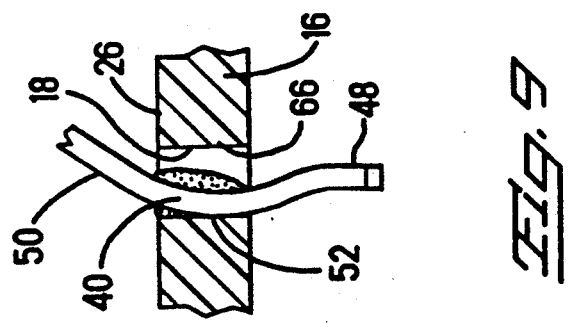
FIG. 9 is an enlarged view of a contact tail portion within a circuit board hole after it has been subjected to a surface mount soldering process.
Figure 8:
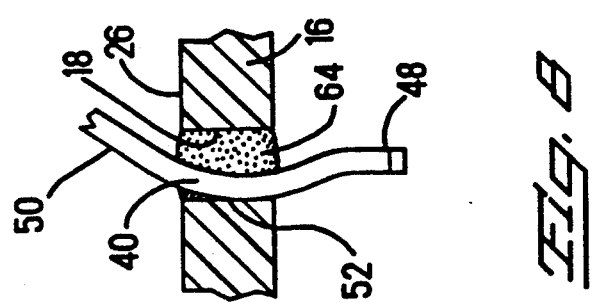
FIG. 8 is an enlarged view of a contact tail portion within a circuit board hole after it has been subjected to a wave soldering process.

FIG. 8 is an enlarged view showing a tail portion 40 within a circuit board hole 18 after it has been subjected to a wave solder process. It is noted that the entire hole 18 is filled with solder 64. Thus, the connector according to the present invention can be used with a wave solder process. However, it is preferable to install the connector 10 at the same time as the surface mount components are installed on the board 16 and to then use a single surface mount solder process for the components and the connector. The result of such surface mount solder process on a tail portion 40 within a hole 18 is shown in FIG. 9. The relatively large radius of curvature of the tail portion 40 keeps the tail portion 40 close to the interior wall of the hole 18. This allows the tail portion 40 to act as a wick for the solder 66 which flows due to the infrared heating of the solder paste. Thus, the relatively small amount of solder which is available in the hole 18 due to the surface mount solder process is concentrated around the tail portion 40. The large radius of curvature of the tail portion 40 results in a maximum size solder fillet. On the other hand, if the tail portion 40 had a small radius of curvature so that it was kinked, then the solder fillet would be small since less of the tail portion will be close to the interior wall of the hole, resulting in a weak solder joint, as opposed to the strong solder joint provided according to this invention. Advantageously, the gentle curve of the tail portions 40, 46 which results in a low insertion force also results in low vibration during insertion. Also, since the high regions 52, 62 remain within the holes 18 and the insertion angles are steep, there is no "snap action" of the tail portions 40, 46. Accordingly, the temporarily held components on the circuit board 16 are not displaced when the connector 10 is mounted to the board prior to the surface mount solder process.

Accordingly, there has been disclosed an improved electrical connector designed to be retained to a circuit board during soldering and which accommodates a surface mount solder joint in a printed circuit board hole. While a preferred embodiment has been disclosed herein, it is understood that various modifications and adaptations to the disclosed embodiment are possible, and it is only intended that this invention be limited by the appended claims. Thus, for example, while the illustrated contacts have the curves of the tail portions formed by curving the stamped contact out of the original plane of the sheet stock material, the curves of the tail portions may alternatively be formed as part of the blanking operation within the original plane of the sheet stock material.

We claim:

1. An electrical connector (10) for mounting to a printed circuit board (16), wherein the printed circuit board is formed with an array of plated through-holes (18), the connector comprising:

a housing (12) having a mounting face (14) and a plurality of contact-receiving passageways therethrough transverse to said mounting face; and a plurality of contacts (32, 34) each disposed in a respective one of said plurality of passageways, each of said contacts including a tail portion (40, 46) extending out of said housing beyond said mounting face, each of said tail portions being smoothly curved over a predetermined length without any sharp bends or kinks from its distal end (48, 56) toward said housing mounting face (14), the distal ends of said tail portions being spaced relative each other so that the distal ends can each be substantially centered over a respective one of said circuit board holes (18) prior to said connector being mounted to said board and while said tail portions are relaxed, said predetermined length being sufficient so that when said connector is mounted to said board with said tail portions extending into said circuit board holes the smooth curve extends from said distal end at least through said circuit board, the curve of each of said tail portions being configured with a high region (52, 62) displaced from a respective axis (54, 58) which passes through the distal end parallel to the direction of insertion of the tail portions into the respective circuit board holes, the high region of each tail portion being so located along said predetermined length of said each tail portion that it is within the respective circuit board hole when the connector is mounted to the board, the curve of each of said tail portions being further configured so that when the tail portions are relaxed and the distal ends of the tail portions are substantially centered over the respective circuit board holes the projection of the high region of each tail portion onto the surface of the circuit board is outside the respective circuit board hole, insertion of each tail portion into its respective circuit board hole causing its high region to be displaced toward its respective axis so that a force normal to the respective axis is applied against the interior wall of the respective circuit board hole.

2. The electrical connector according to claim 1 wherein each of the plurality of contacts (32, 34) is formed from planar sheet stock material and each of the tail portions (40, 46) is curved transverse to the plane of the sheet stock material.

3. The electrical connector according to claim 1 wherein each of the plurality of contacts (32, 34) is formed from sheet stock material in a blanking process and the curves of each of the tail portions (40, 46) are formed as part of the blanking process.

4. The electrical connector according to claim 1 wherein the curve of each tail portion (40, 46) is chosen so that the insertion force for entry of the tail portion into the respective circuit board hole (18) is substantially equal to the retention force opposing removal of the tail portion from the respective circuit board hole, the retention force being the result of the normal force applied to the interior wall due to the displacement of the high region (52, 62) toward the respective axis (54, 58).

5. The electrical connector according to claim 4 wherein the curve of each tail portion (40, 46) includes an arc of a circle.

6. The electrical connector according to claim 1 wherein the distal end (48, 56) of each tail portion (40, 46) is a generally straight section substantially parallel to the respective axis (54, 58) when the tail portion is relaxed.

7. The electrical connector according to claim 1 wherein each tail portion (40, 46) is curved from where it extends out of said housing (12) in a first direction beyond the respective axis (54, 58) to the high region (52, 62) and then back toward the respective axis.

8. The electrical connector according to claim 7 wherein the curve of each tail portion (40, 46) includes an arc of a circle.

9. The electrical connector according to claim 8 wherein the distal end (48, 56) of each tail portion (40, 46) is a generally straight section substantially parallel to the respective axis (54, 58) when the tail portion is relaxed.

10. The electrical connector according to claim 1 wherein the tail portions (40, 46) are divided into two groups with the tail portions of the two groups being curved in opposite directions from each other.

* * * * *